United States Patent
Ruppi

(10) Patent No.: US 6,689,450 B2
(45) Date of Patent: Feb. 10, 2004

(54) ENHANCED $AL_2O_3$-TI(C,N) MULTI-COATING DEPOSITED AT LOW TEMPERATURE

(75) Inventor: Sakari Ruppi, Fagersta (SE)

(73) Assignee: Seco Tools AB, Fagersta (SE)

( * ) Notice: Subject to any disclaimer, the term of this patent is extended or adjusted under 35 U.S.C. 154(b) by 0 days.

(21) Appl. No.: 09/817,025

(22) Filed: Mar. 27, 2001

(65) Prior Publication Data

US 2002/0176755 A1 Nov. 28, 2002

(51) Int. Cl.$^7$ .............................. B23B 27/14; B23P 15/28
(52) U.S. Cl. ...................... 428/216; 407/118; 407/119; 428/336; 428/469; 428/472; 428/698; 428/701; 428/702; 51/307; 51/309
(58) Field of Search ................................ 407/118, 119; 428/701, 472, 702, 469, 216, 336, 698; 51/307, 309

(56) References Cited

U.S. PATENT DOCUMENTS

| | | | |
|---|---|---|---|
| 4,746,563 A | | 5/1988 | Nakano et al. |
| 4,984,940 A | | 1/1991 | Bryant et al. |
| 5,587,233 A | * | 12/1996 | Konig et al. |
| 5,635,247 A | | 6/1997 | Ruppi |
| 5,681,651 A | * | 10/1997 | Yoshimura et al. |
| 5,700,569 A | | 12/1997 | Ruppi |
| 5,786,069 A | * | 7/1998 | Ljungberg et al. |
| 5,902,671 A | * | 5/1999 | Kutscher |
| 5,968,595 A | | 10/1999 | Kutscher |
| 6,015,614 A | | 1/2000 | Ruppi |
| 6,210,726 B1 | * | 4/2001 | Schiller et al. |
| 6,383,624 B1 | * | 5/2002 | Soderberg et al. |

FOREIGN PATENT DOCUMENTS

| | | | |
|---|---|---|---|
| EP | 0 686 707 A1 | | 12/1995 |
| EP | 0727510 | * | 8/1996 |
| EP | 0947607 | * | 10/1999 |
| EP | 1 103 635 A2 | | 5/2001 |
| EP | 1 118 688 A1 | | 7/2001 |
| EP | 1 122 334 A1 | | 8/2001 |
| WO | 9720083 | * | 6/1997 |
| WO | 9927155 | * | 6/1999 |
| WO | 9929920 | * | 6/1999 |
| WO | WO 99/29921 | | 6/1999 |
| WO | 0003062 | * | 1/2000 |
| WO | WO 00/52225 | | 9/2000 |
| WO | 0068452 | * | 11/2000 |

OTHER PUBLICATIONS

U.S. patent application Ser. No. 09/207.687, Ruppi, filed Dec. 9, 1998.
U.S. patent application Ser. No. 09/498,244, Ruppi, filed Feb. 4, 2000.
U.S. patent application Ser. No. 09/717,006, Sulin et al., filed Nov. 22, 2000.

* cited by examiner

Primary Examiner—Archene Turner
(74) Attorney, Agent, or Firm—Burns, Doane, Swecker & Mathis, L.L.P.

(57) ABSTRACT

A coated body having a multi-layer of $\kappa\text{-}Al_2O_3$ and or $\gamma\text{-}Al_2O_3$ or TiN applied by MTCVD (Medium Temperature Chemical Vapor Deposition) is disclosed. The multi-layers can be interspersed with layers of Ti(C,N) which can also be applied by MTCVD. The body which is coated is preferably a cemented carbide, cermet, ceramic and/or high speed steel and may be used as a metal cutting insert.

16 Claims, 4 Drawing Sheets

SS 2258
$v_c$ = 275m/min
f = 0.4 mm/r
$a_p$ = 2.5 mm

SS 1672
$v_c$ = 250m/min, cutting time 2, 9 and 15 min
f = 0.4 mm/r
$a_p$ = 2.5 mm

ENHANCED AL₂O₃-TI(C,N) MULTI-COATING DEPOSITED AT LOW TEMPERATURE

BACKGROUND OF THE INVENTION

Multi-layers of κ-Al$_2$O$_3$ and Ti(C,O) or κ-Al$_2$O$_3$ and TiN have proved to exhibit better wear properties than single oxide layers, see U.S. Pat. No. 5,700,569 and U.S. Ser. No. 09/717,006.

The deposition process of these prior art multi-layers is, however, relatively long and deposition is usually carried out at relatively high temperatures (usually at about 1000° C.), resulting in the transformation of kappa-alumina to alpha-alumina. The volume shrinkage encountered in the phase transformation will reduce adhesion of the alumina layers. As a result, adhesion problems in production will occur.

It has usually been thought that deposition temperatures of about 1000° C. or higher are needed to deposit Al$_2$O$_3$ coatings. As shown in the recent U.S. application Ser. No. 09/498,344, Al$_2$O$_3$ can be deposited at the deposition temperatures about or exceeding 800° C., but less than 1000° C. Further, it was shown that the two Al$_2$O$_3$ phases, κ and γ, could be deposited in a controlled way.

It has recently been confirmed that Ti(C,N) exhibits better wear resistance against crater wear and flank wear in hypoeutectoid steels than TiN (U.S. Ser. No. 09/207,687). In recent in-house cutting tests, it has also been found that in hypereutectoid steel, Ti(C,N) is better that TiN, especially with respect to flank wear. In hyper-eutectic steel, Al$_2$O$_3$ is a superior coating material against crater wear. In recent cutting tests in-house, it has also been found that the adhesion of both κ and γ phases to the MTCVD Ti(C,N) deposited at 800° C. is surprisingly good. By depositing κ or γ with MTCVD Ti(C,N) as a multi-layer, the wear properties of the prior art TiN/Ti(C,O)-κ multi-layers could thus be enhanced.

OBJECTS AND SUMMARY OF THE INVENTION

It is an object of this invention to avoid or alleviate the problems of the prior art.

It is further an object of this invention to provide enhanced wear properties of TiN/Ti(C,O)-κ multi-layers by depositing κ or γ with MTCVD Ti(C,N) as a multi-layer.

In one aspect of the invention there is provided a coated body wherein the coating comprises a multi-layer of γ-Al$_2$O$_3$.

In another aspect of the invention there is provided a coated body wherein the coating comprises a multi-layer of κ-Al$_2$O$_3$ and/or γ-Al$_2$O$_3$ layers interspersed with layers of Ti(C,N) on a layer of Ti(C,N).

In another aspect of the invention there is provided a coated body wherein the coating comprises a multi-layer of κ-Al$_2$O$_3$ and γ-Al$_2$O$_3$, each applied by a chemical vapor deposition at a temperature of from 700 to 900° C.

In another aspect of the invention there is provided a coated body wherein the coating comprises a multi-layer of κ-Al$_2$O$_3$ and/or γ-Al$_2$O$_3$ layers interspersed with layers of Ti(C,N) on a layer of Ti(C,N).

In yet another aspect of the invention there is provided a coated body wherein the coated comprises a multi-layer of κ-Al$_2$O$_3$ and/or γ-Al$_2$O$_3$ layers interspersed with layers of Ti(C,N) on a layer of Ti(C,N) and with a layer of Ti(C,N) atop of the said multi-layer.

DETAILED DESCRIPTION OF THE PREFERRED EMBODIMENTS OF THE INVENTION

Figure 1A:
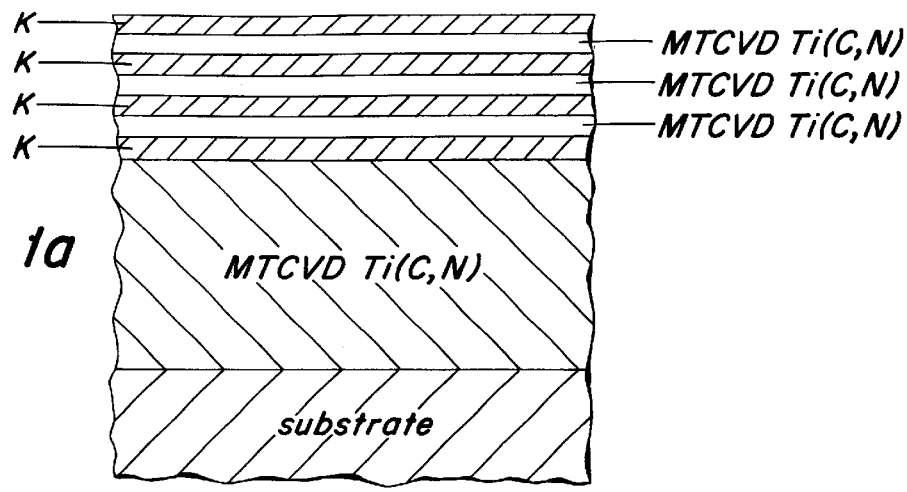
FIG. 1 is a representation of a coated body of the present invention including κ-Al$_2$O$_3$ multi-layers (FIG. 1a), γ-Al$_2$O$_3$ with multi-layers (FIG. 1b) and a mixed γ- and κ-Al$_2$O$_3$ multi-layer (FIG. 1c).
Figure 1B:
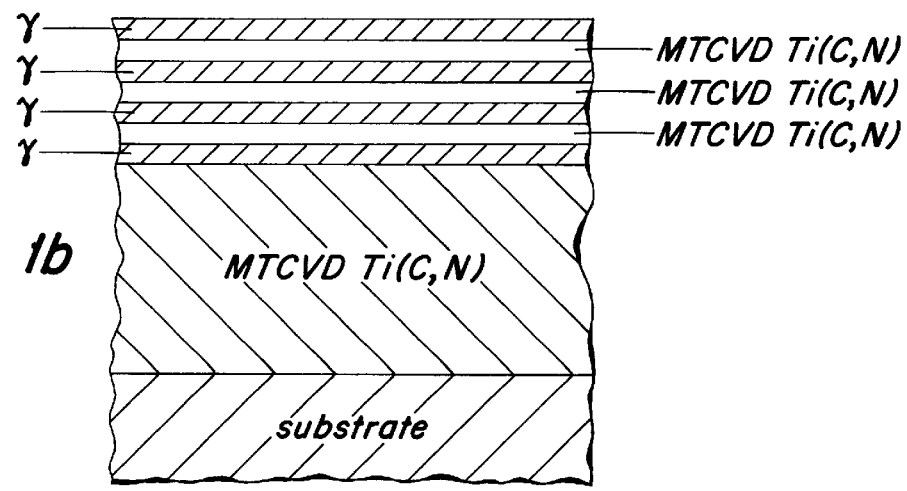
Figure 1C:
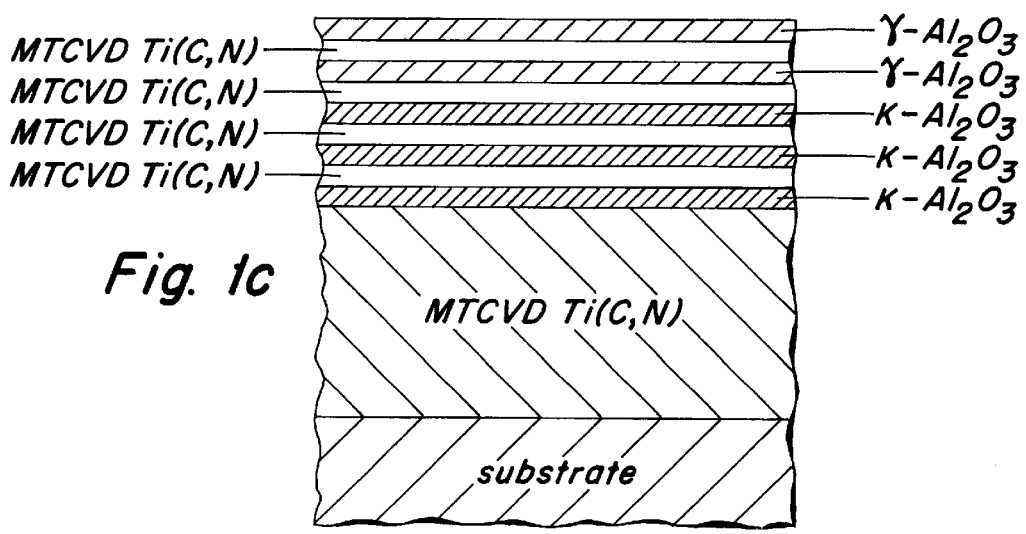

FIG. 1 shows a schematic of the coating layer according to this invention. The coating is composed of the following layers:

1. MTCVD Ti(C,N) base layer, deposition temperature 800–900° C.
2. Multi-layer structure consisting of κ-Al$_2$O$_3$ (FIG. 1a), γ-Al$_2$O$_3$ (FIG. 1b) or both (FIG. 1c), together with MTCVD Ti(C,N) interlayers, all deposited at a temperature of 800–900° C. The wear properties of γ are not yet fully elucidated. However, γ is a less stable phase than κ and can be used only in the uppermost layers of the multi-coating structure which will be subjected to the shortest annealing during deposition.

The Al$_2$O$_3$ layers in the multi-layer (whether γ or κ) have an individual thickness of from about 0.1 to 3.2 microns, preferably about 0.3 to 1.2 microns. The Ti(C,N) layers in the multi-layer have an individual thickness of from about 0.1 to about 3.2 microns, preferably from about 0.3 to about 1.2 microns. The total thickness of the multi-layer is from about 3 to about 30 microns, preferably from about 5 to 15 microns. The multi-layer may also be deposited onto a Ti(C,N) layer of from about 2 to about 15 microns, preferably from about 3 to 10 microns, which in this instance is the first layer applied onto the body. In addition, a Ti(C,N) layer of the same thickness can be deposited atop the outermost layer of the alumina.

The body is preferably formed of a cemented carbide, a cermet, a ceramic, or a high speed steel and the coated body is preferably used as a cutting tool in metal cutting operations.

The γ- and κ-Al$_2$O$_3$ layers as well as the Ti(C,N) layers are applied by MTCVD (Medium Temperature Chemical Vapor Deposition). The deposition of the γ- and κ-Al$_2$O$_3$ layers utilize the technique described in my copending U.S. patent application Ser. No. 09/498,334, herein incorporated by reference. In that process, H$_2$S is added to the otherwise conventional MTCVD techniques and apparatus in amounts greater than 0.7 vol %, generally 0.75 to 1.7 vol %, preferably greater than 1 up to about 1.5 vol %, of the total gaseous mixture.

The coating process is performed at temperatures of from about 700 to 900° C., preferably 750 to 850° C., at a pressure of from about 50 to 600 mbar, preferably from about 100 to 300 mbar, for a time sufficient to form the coating, generally from about 2 to 10 hours, preferably from about 4 to 8 hours.

It should be noted that the deposition of $Al_2O_3$ can be carried out at the same temperature as the MTCVD (Ti(C,N) layers, resulting in considerably shorter processes (the heating up/cooling down steps are eliminated) and the deposition of the multi-layer is carried out at relatively low temperature, resulting in no phase transformations. As a result, enhanced adhesion will be obtained and production yield will be enhanced. The multi-layer coating can be composed of both κ and γ which can simply be controlled by $H_2S$. The γ phase which is less stable than κ should be situated in the uppermost part (i.e., top half) of the multi-coating layer, if used; and as shown earlier, MTCVD Ti(C, N) exhibits better wear resistance than TiN. By using Ti(C,N) instead of TiN, crater wear resistance in hypo-eutectic steels and flank wear resistance in hyper-eutectic steels will be enhanced.

The invention is additionally illustrated in connection with the following Examples which are to be considered as illustrative of the present invention. It should be understood, however, that the invention is not limited to the specific details of the Examples.

EXAMPLE 1

Tables 1 and 2 show a summary of the wear properties of different coating in SS1672 and SS2258 (hypo- and hyper-eutectic steels, respectively)

TABLE 1

| SS1672 | | | | |
|---|---|---|---|---|
| | Crater Wear | Flank Wear | Notch Wear | Deformation |
| α-$Al_2O_3$ | − − − | − − − | + + | + + |
| κ-$Al_2O_3$ | − − − | − − − | + + | + + + |
| TiCN (MTCVD) | + + | + + + | − | − |
| TiCN (CVD) | + + + | + + + | − | − |
| TiN (CVD) | + | + + | + + | − − |
| TiC (CVD) | + | + + + | − | − |

TABLE 2

| SS2258 | | | | |
|---|---|---|---|---|
| | Crater Wear | Flank Wear | Notch Wear | Deformation |
| α-$Al_2O_3$ | + + + | − − | + + | + + |
| κ-$Al_2O_3$ | + + + | − | + + | + + + |
| TiCN (MTCVD) | − − | + + + | − | − |
| TiCN (CVD) | − − | + + + | − | − |
| TiN (CVD) | − − | + | − | − − |
| TiC (CVD) | − − − | + + + | − | − |

Figure 2A:
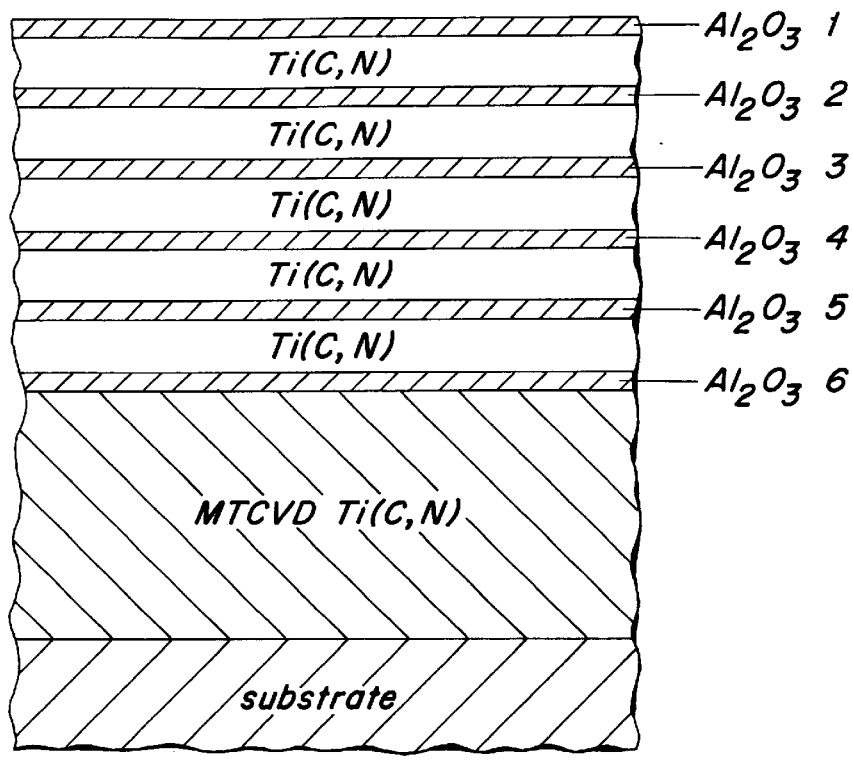
FIG. 2 is a representation of a coated body of the present invention useful in cutting of SS1672 (FIG. 2a) and SS2258 (FIG. 2b).
Figure 2B:
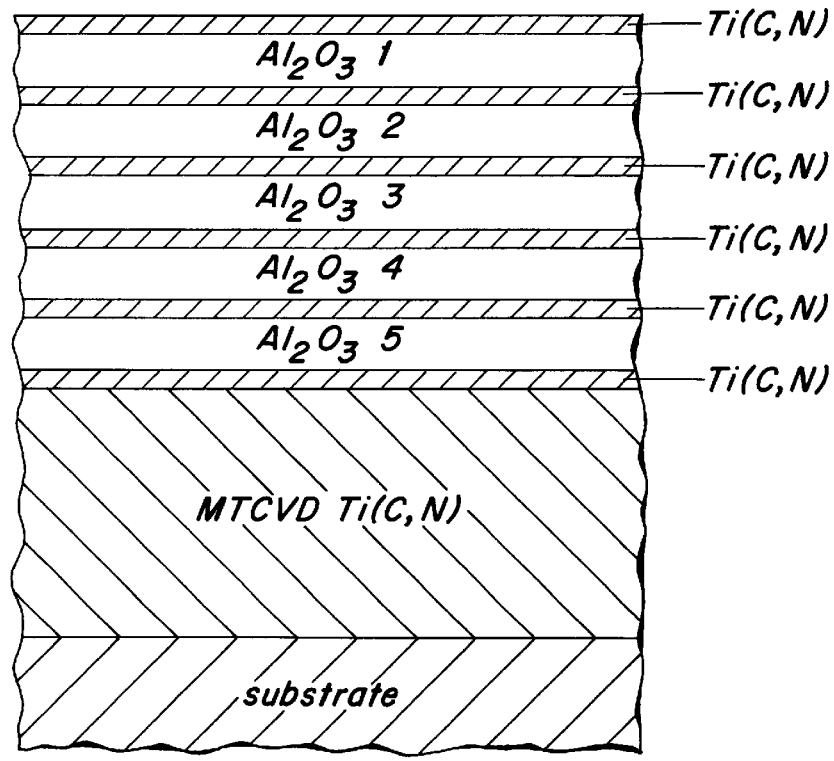

As can be seen, the coating material may show very different behaviors in these steels. Consequently, different coating structures have to be developed for SS1672 (thin $Al_2O_3$ layers+thick Ti(C,N) layers, FIG. 2a) and for SS2258 (thick $Al_2O_3$ layers+thin Ti(C,N) layers, FIG. 2b) in accordance with the knowledge of the skilled artisan. Schematics of the optimized coating structures for these steel are shown in FIGS. 2a and 2b.

EXAMPLE 2

Cutting tests were performed in SS1672 and SS2258. The coating, according to FIG. 2a, being composed of 6 κ-$Al_2O_3$ layers interspersed by layers of Ti(C,N), (total multi-layer thickness 7 μm) was tested on SS1672 and a coating deposited according to FIG. 2b, being composed of 5 κ-$Al_2O_3$ layers interspersed by layers of Ti(C,N) (total multi-layer thickness 7 μm) was tested on SS2258. Cutting tests were also conducted using inserts having single layers of $Al_2O_3$, TiN and Ti(C, N) as well as a multi-layer of κ-alumina and TiN were compared. The results are given in Tables 3 and 4.

TABLE 3

| SS1672, Cutting Speed 250 m/min | | |
|---|---|---|
| Coating | Life time/min | Failure Mode |
| $Al_2O_3$ | 11 | crater wear |
| TiN | 15 | crater wear + notch |
| TiCN | 19 | crater wear + notch |
| Multi κ + TiN | 25 | crater wear |
| Multi κ + TiCN | 39 | crater wear |

TABLE 4

| SS2258, Cutting Speed 200 m/min | | |
|---|---|---|
| Coating | Life time/min | Failure Mode |
| $Al_2O_3$ | 15 | flank wear |
| TiN | 8 | crater wear |
| TiCN | 8 | crater wear |
| Multi κ + TiN | 25 | flank wear |
| Multi κ + TiCN | 32 | flank wear |

EXAMPLE 3

Figure 3:
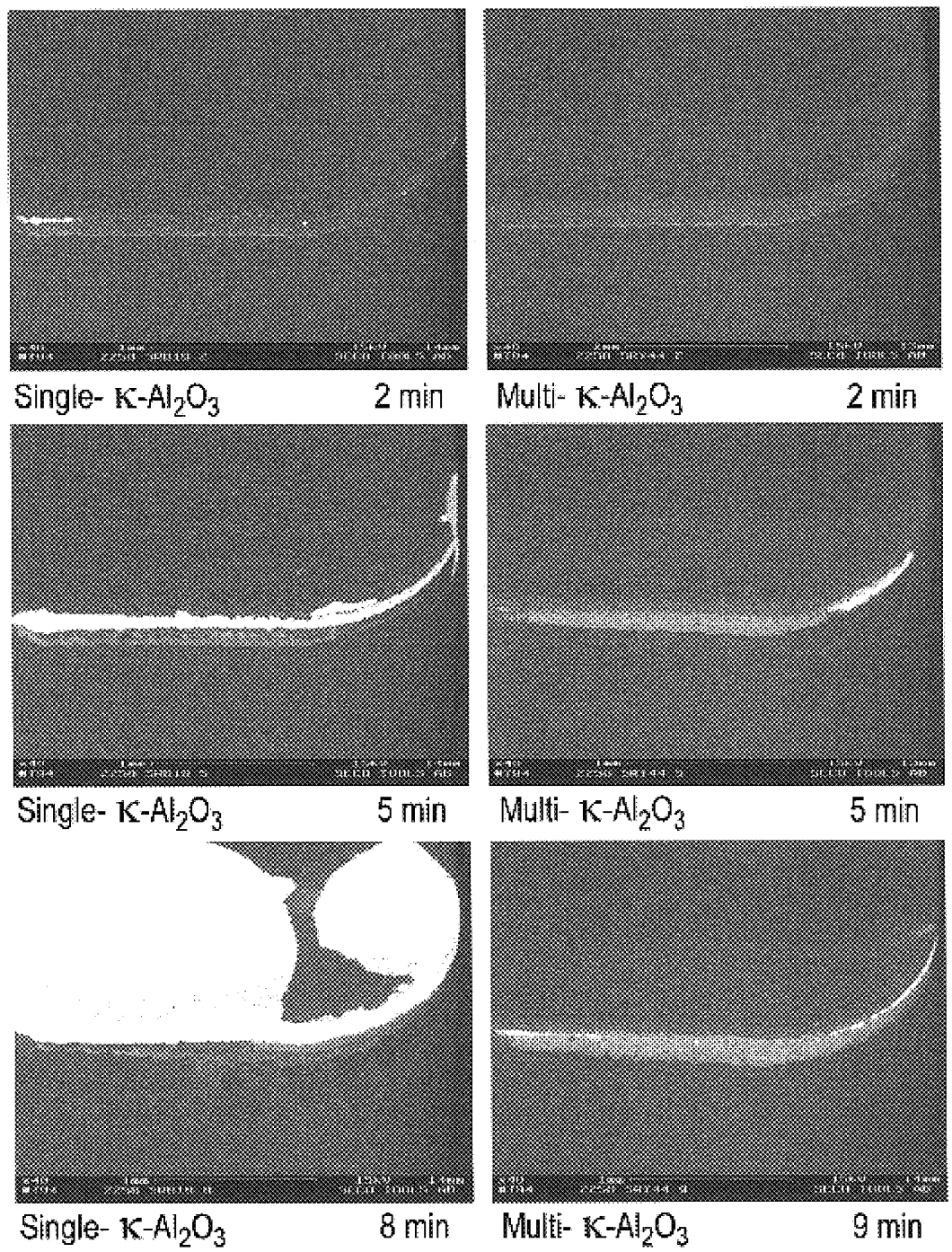
FIG. 3 shows Scanning Electron Microscope (SEM) images of the cutting edges of single and multi-layer κ-Al$_2$O$_3$ coated inserts after turning of 2, 5 and 8 minutes (9 minutes for the multi-layer κ-Al$_2$O$_3$ coated insert) of SS2258.

A detailed comparison of the behaviors of a single layer and a multi-layer coating (FIG. 2b) in turning SS2258, is presented in FIG. 3. The multi-layer coating is superior to the single layer SS2258. In this steel, the flank wear is clearly reduced by the Ti(C,N) coatings. It is clear from the SEM micrograph that both crater wear and flank wear resistance of the multi-layer κ-$Al_2O_3$ coated inserts were superior to those of the single κ-$Al_2O_3$ coated inserts. In this kind of steel where alumina-coated inserts in general perform well, the effects of the multi-layering is very clear. The lifetime of the insert is drastically increased, in particular at 200 m/min more than about 100%. In ball-bearing steel, SS2258 (hypereutectoid steel), a multi layering results in much more drastically reduced wear than observed earlier in hypoeutectoid steels (U.S. Pat. No. 5,700,569).

EXAMPLE 4

Figure 4:
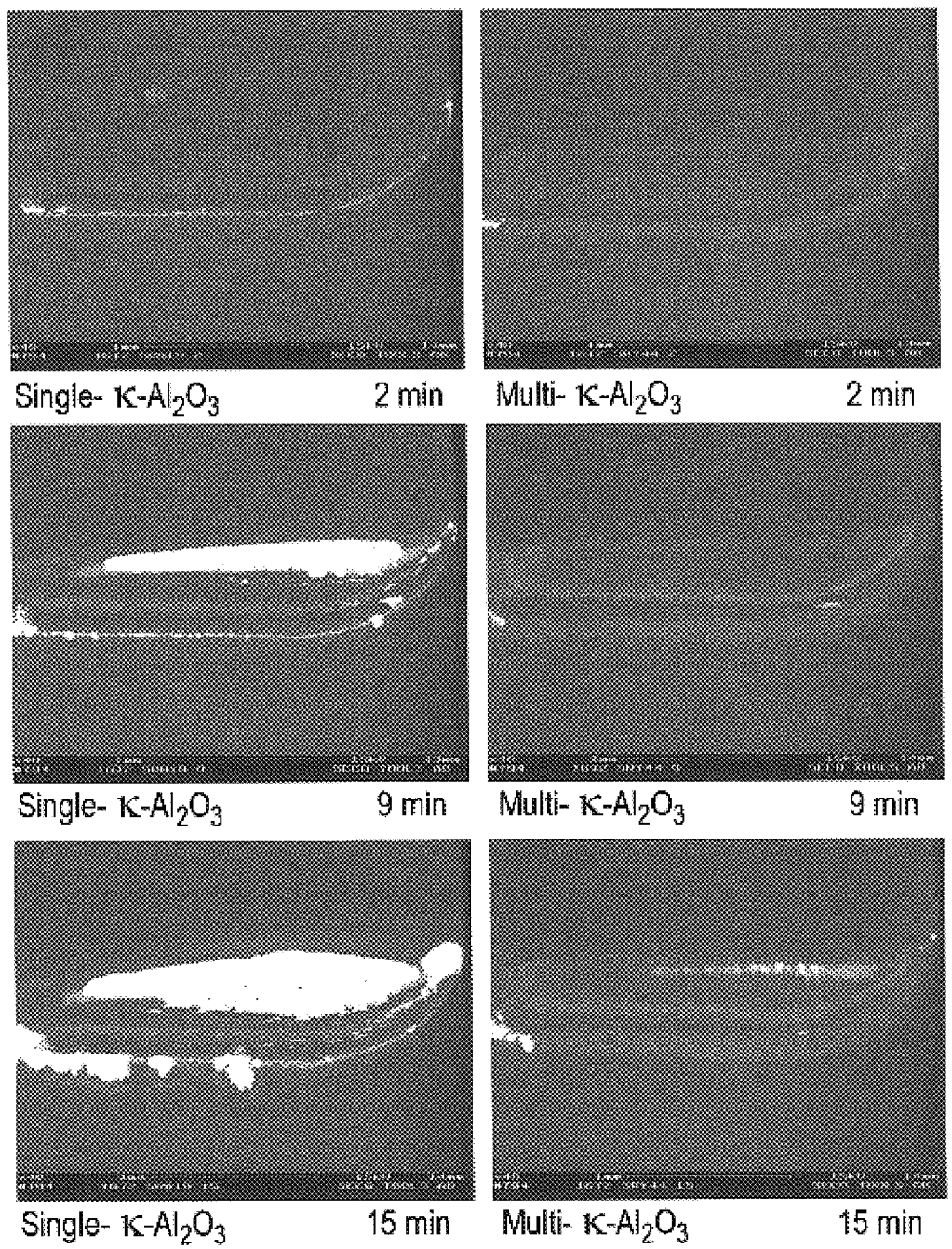
FIG. 4 shows Scanning Electron Microscope (SEM) images of the cutting edges of single and multi-layer κ-Al$_2$O$_3$ coated inserts after turning of 2, 9 and 15 minutes of SS1678.

A detailed comparison of the behaviors of a single layer and a multi-layer coating (FIG. 2b) in turning of SS1672, is presented in FIG. 4. The multi-layer coating is superior to the single layer also in SS1672. Compared with miltilayer κ-$Al_2O_3$ coatings according to U.S. Pat. No. 5,700,569, mulitlayers of κ-$Al_2O_3$ with Ti(C,N) together with reduced thickness of the alumina layers enhanced the performance of the inserts over the prior art. It appears clear from the SEM micrograph that both crater wear and flank wear resistances were superior to those exhibited by the single layer. In this steel, the flank wear is clearly reduced more than earlier observed when multi-layer coatings of κ-$Al_2O_3$ and Ti(C,O) were investigated (U.S. Pat. No. 5,700,569).

The principles, preferred embodiments and modes of operation of the present invention have been described in the foregoing specification. The invention which is intended to be protected herein, however, is not to be construed as limited to the particular forms disclosed, since these are to be regarded as illustrative rather than restrictive. Variations and changes may be made by those skilled in the art without departing from the spirit of the invention.

What is claimed is:

1. A coated body wherein the coating comprises a multi-layer of $\kappa$-$Al_2O_3$ and/or $\gamma$-$Al_2O_3$ layers interspersed with layers if Ti(C,N).

2. The coated body of claim 1, wherein the multi-layer is applied by chemical vapor deposition at a temperature of from 700 to 900° C.

3. A coated body wherein the coating comprises a multi-layer CVD of $\kappa$-$Al_2O_3$ and CVD $\gamma$-$Al_2O_3$, each applied by a chemical vapor deposition at a temperature of from 700 to 900° C.

4. The coated body of any of claims 1 and 3 wherein a layer of Ti(C,N) is atop the multi-layers of $\gamma$ and/or $\kappa$-$Al_2O_3$.

5. The coated body of claim 3 wherein the $\gamma$-$Al_2O_3$ layers comprise the uppermost alumina layers and the $\kappa$-$Al_2O_3$ layers comprise the innermost alumina layers.

6. The coated body of any of claims 1 and 3 wherein the multi-layers have a total thickness of from about 3 to about 30 microns.

7. The coated body of claim 6 wherein the multi-layers have a total thickness of from about 5 to about 15 microns.

8. The coated body of any of claims 1 and 3 wherein the said body is selected from the group consisting of a cemented carbide, cermet, ceramic, high speed steel and mixtures thereof.

9. A metal cutting tool made from the coated body of claim 8.

10. The coated body of any of claims 1 and 3 wherein the multi-layers of $\gamma$- and/or $\kappa$-$Al_2O_3$ are interspersed with layers of Ti(C,N).

11. The coated body of claim 10 wherein the multi-layers of $\gamma$ and/or $\kappa$-$Al_2O_3$ comprise layers having a thickness of from about 0.1 about 3.2 microns.

12. The coated body of claim 10 wherein the multi-layers of $\gamma$ and/or $\kappa$-$Al_2O_3$ comprise layers having a thickness of from about 0.3 to about 1.2 microns.

13. The coated body of claim 10 wherein the layers of Ti(C,N) comprise layers having a thickness of from about 0.1 to about 3.2 microns.

14. The coated body of claim 10 wherein the layers of Ti(C,N) comprise layers having a thickness of from about 0.3 to about 1.2 microns.

15. A coated body wherein the coating comprises a multi-layer of CVD $\kappa$-$Al_2O_3$ and/or CVD $\kappa$-$Al_2O_3$ layers interspersed with layers of Ti(C,N) on a layer of Ti(C,N).

16. A coated body wherein the coated comprises a multi-layer of CVD $\kappa$-$Al_2O_3$ and/or CVD $\kappa$-$Al_2O_3$ layers interspersed with layers of Ti(C,N) on a layer of Ti(C,N) and with a layer of Ti(C,N) atop of the said multi-layer.

* * * * *